United States Patent
Tran et al.

(10) Patent No.: US 7,236,054 B2
(45) Date of Patent: Jun. 26, 2007

(54) MULTI-OPERATIONAL AMPLIFIER SYSTEM

(75) Inventors: Hieu Van Tran, San Jose, CA (US); Anh Ly, San Jose, CA (US); Sang Thanh Nguyen, Union City, CA (US); Vishal Sarin, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 19 days.

(21) Appl. No.: 10/767,248

(22) Filed: Jan. 28, 2004

(65) Prior Publication Data

US 2005/0162230 A1 Jul. 28, 2005

(51) Int. Cl.
*H03F 3/45* (2006.01)

(52) U.S. Cl. .............................. 330/253; 330/9; 330/51; 330/69; 330/124 R; 330/147; 330/285; 330/295; 310/311

(58) Field of Classification Search ................. 330/51, 330/124 R, 253, 285, 295
See application file for complete search history.

(56) References Cited

U.S. PATENT DOCUMENTS

| | | | |
|---|---|---|---|
| 3,988,689 A * | 10/1976 | Ochi et al. ...................... 330/9 |
| 4,596,957 A * | 6/1986 | Fukaya et al. ............... 330/252 |
| 5,175,508 A * | 12/1992 | Gingrich et al. .............. 330/84 |
| 5,212,455 A * | 5/1993 | Pernici et al. ............... 330/253 |
| 5,256,987 A * | 10/1993 | Kibayashi et al. .......... 330/295 |
| 5,604,464 A * | 2/1997 | Hwang et al. ............... 330/253 |
| 5,621,358 A * | 4/1997 | Pisati et al. ................. 330/253 |
| 5,631,606 A * | 5/1997 | Tran ........................... 330/253 |
| 5,982,230 A * | 11/1999 | MacBeth ........................ 330/9 |
| 6,069,525 A * | 5/2000 | Sevic et al. ................... 330/51 |
| 6,121,817 A * | 9/2000 | Yang et al. .................. 327/355 |
| 6,137,355 A * | 10/2000 | Sevic et al. ................... 330/51 |
| 6,181,204 B1 * | 1/2001 | Smith et al. ................ 330/261 |
| 6,285,251 B1 * | 9/2001 | Dent et al. .................. 330/127 |
| 6,304,141 B1 * | 10/2001 | Kennedy et al. ............ 330/253 |
| 6,628,168 B2 * | 9/2003 | Martin et al. ............... 330/253 |
| 6,639,463 B1 * | 10/2003 | Ghanadan et al. ...... 330/124 R |
| 2003/0006841 A1 * | 1/2003 | Martin et al. ............... 330/253 |
| 2003/0025553 A1 * | 2/2003 | Faris ........................... 330/51 |

* cited by examiner

*Primary Examiner*—Khai M. Nguyen
(74) *Attorney, Agent, or Firm*—DLA Piper US LLP

(57) ABSTRACT

A multi-operational amplifier system comprises a plurality of operational amplifiers and a controller to configure the plurality of operational amplifiers. The operational amplifiers may be selectively configured to operate individually or in combination with other of the operational amplifiers. The operational amplifiers may have different common node inputs. In one aspect, the different inputs may be selected from groups of PMOS, N-type NMOS and NZ NMOS inputs. The operational amplifiers may include the different inputs that are arranged as differential pairs.

23 Claims, 11 Drawing Sheets

MULTI-OPERATIONAL AMPLIFIER SYSTEM

BACKGROUND

This invention relates to operational amplifiers, and more particularly to multi-operational amplifier systems.

Conventional operational amplifiers have limited common input ranges. Conventional complementary input operational amplifiers have a larger input common mode range, but the range is limited dependent on the threshold voltages of the input transistors of the operational amplifier. This range is described in conjunction with FIG. 1.

FIG. 1 is a graph illustrating the input-output transfer characteristics of conventional operational amplifiers. A P line 101 having a sloped portion and a horizontal portion illustrates the input-output transfer characteristics of a conventional operational amplifier having an input differential pair that includes a PMOS transistor pair. A Z-shaped N line 102 illustrates the input-output transfer characteristics of a conventional operational amplifier having an input differential pair that includes an NMOS transistor pair. As shown in FIG. 1, the PMOS based operational amplifier and the NMOS based operational amplifier each have a limited common input range.

Furthermore, in a mixed mode system, the usage of a particular operational amplifier configuration may be different for different analog paths, e.g., as a fixed reference unity buffer, a gain amplifier, and a rail-to-rail buffer. The usage also may be different at different times, e.g., as an input path or output path.

SUMMARY

A multi-operational amplifier system may provide a spatial and temporal adjustable operational amplifier that may be configured depending on requirements from different paths (spatial) or time (temporal). A multi-operational amplifier system comprises a plurality of operational amplifiers and a controller to configure the plurality of operational amplifiers. The multi-operational amplifier system may be configured to couple the inputs and the outputs of the plurality of operational amplifiers so that the operational amplifiers may be combined into one or multiple operational amplifiers.

In one aspect, a multi-operational amplifier system includes a plurality of operational amplifiers that may have different types of inputs, such as PMOS, NMOS and NZ NMOS and are configured to combine the operational amplifiers to provide outputs based on combinations of the inputs. The multi-operational amplifier system has an extended wide common mode input. The multi-operational amplifier system may have enhanced switching bias.

DETAILED DESCRIPTION

As used herein, a N-type NMOS enhancement transistor is an enhancement transistor having a gate threshold, for example in the range of approximately 0.3 to 1.0 volts. A P-type transistor is a PMOS enhancement transistor having a gate threshold approximately in the range of −0.3 to −1.0 volts. A NZ NMOS transistor is a native transistor having a gate threshold approximately in the range of −0.1 to 0.3 volts.

A configurable multi-operational amplifier having extended wide common mode inputs is described.

Figure 1:
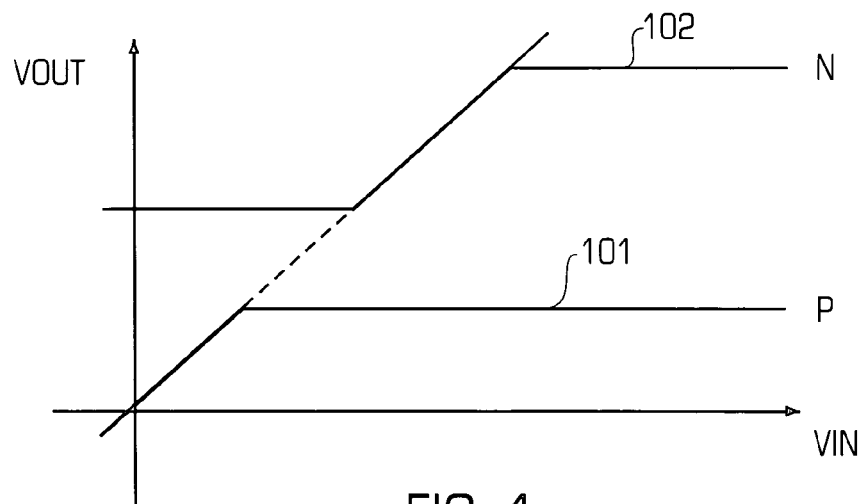
FIG. 1 is a graph illustrating the input-output transfer characteristics of conventional operational amplifiers.
Figure 2:
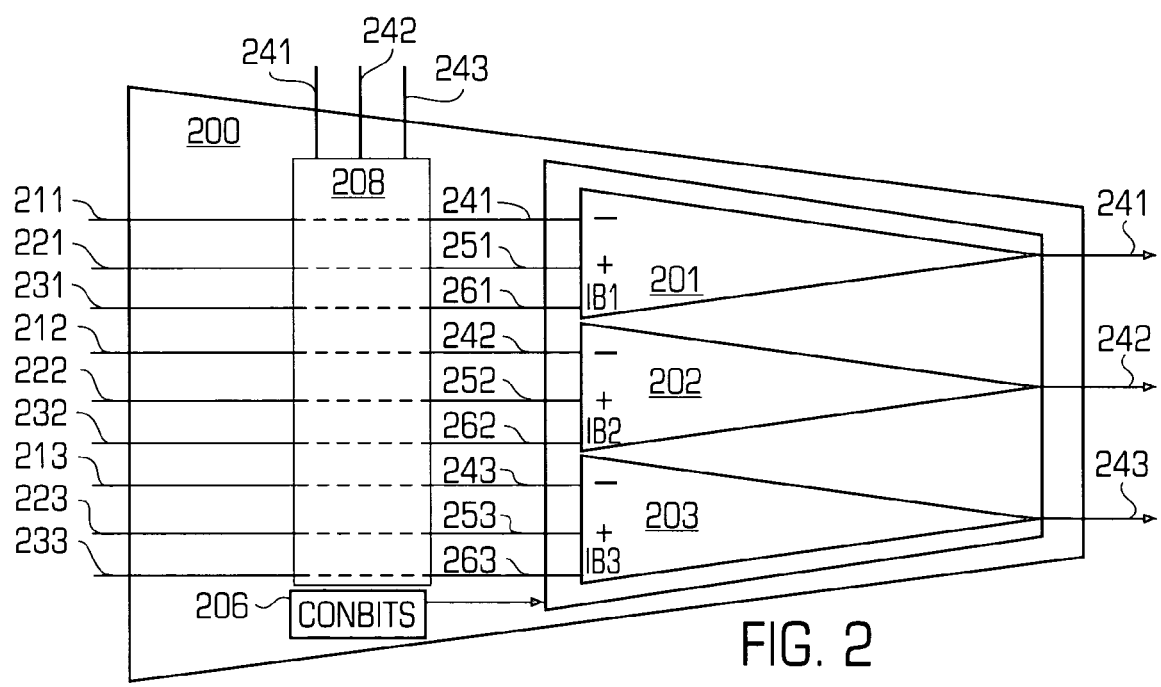
FIG. 2 is a schematic diagram illustrating a multi-operational amplifier system.

FIG. 2 is a schematic diagram illustrating a multi-operational amplifier system 200.

The multi-operational amplifier system 200 comprises a plurality of operational amplifiers 201, 202, and 203, a configuration controller 206, and an interconnect network 208. For clarity, three operational amplifiers are shown in FIG. 2, but the multi-operational amplifier system 200 may include other numbers of operational amplifiers. The operational amplifiers 201, 202, 203 may be different, such as different input types (e.g., PMOS, N-type NMOS, or NZ NMOS inputs), by operational amplifier type (e.g., output transconductance amplifier or folded cascode operational amplifier), or by functions (e.g., fixed or adaptive bias). The configuration controller 206 controls the interconnect network 208 to configure the multi-operational amplifier system 200. The configuration controller 206 may control configurability, for example, by non-volatile fuses, registers, metal interconnects, or real time digital control logic.

The interconnect network 208 couples a plurality of inputs received by the multi-operational amplifier system 200 to the operational amplifiers 201, 202 and 203. In one embodiment, the interconnect network 208 selectively applies the inputs to the operational amplifiers 201, 202, and 203 in response to the configuration controller 208. In another embodiment, the application of the inputs by the interconnect network 208 may be fixed, such as by metal interconnects. The inputs to the multi-operational amplifier system 200 may be configurable depending on the environment. Such configuration may include multiple operational amplifier availability, multiple input range availability, trading off power versus performance, or configuring the operational amplifier as desired in real time, depending on the application or environment at the time. The inputs to the multi-operational amplifier system 200 are negative inputs 211, 212 and 213, positive inputs 221, 222, and 223, and first (IB1), second (IB2), and third (IB3) bias currents 231, 232, and 233, respectively. The interconnect network 208 couples these inputs and bias currents to negative inputs 241, 242 and 243, positive inputs 251, 252, and 253, and first (IB1), second (IB2), and third (IB3) bias current inputs 261, 262, and 263, respectively, of the respective operational amplifiers 201, 202, and 203. The operational amplifiers 201, 202 and 203 include outputs 241, 242, and 243, respectively, which the interconnect network 200 may couple to the inputs 211, 212, 213, 221, 222, or 223.

The multi-operational amplifier 200 may be configured to select combinations of the operational amplifiers 201, 202, 203 by selectively connecting the inputs or outputs or both. The configuration controller 206 may connect or disconnects the operational amplifiers 201, 202 and 203 to operate individually or in various combinations so that the multi-operational amplifier system 200 has different transfer characteristics. In one embodiment, the operational amplifiers 201, 202 and 203 include a PMOS input, a N-type NMOS input, and a NZ NMOS input, respectively. In such embodiment, the multi-operational amplifier system 200 may be configured to have transfer characteristics of, for example, N-type NMOS and NZ NMOS inputs (FIG. 3A), NZ NMOS and PMOS inputs (FIG. 3B), PMOS, N-type NMOS and NZ NMOS inputs (FIG. 3C), or PMOS input, N-type NMOS input or NZ NMOS input individually (shown as the respective lines 301, 302 and 303).

In one embodiment, the input (e.g., the negative input 211) of one of the operational amplifiers 201, 202, 203 (e.g., 201) is coupled to the input of at least one of the other operational amplifiers (e.g., 202, 203 or both 202 and 203). In another embodiment, the input (e.g., the negative input 211) of one of the operational amplifiers 201, 202, 203 (e.g., 201) is not coupled to the input of the other operational amplifiers (e.g., both 202 and 203), and the inputs (e.g. negative inputs 212 and 213) of the other operational amplifiers (e.g., both 202 and 203) are coupled together. In a multi-operational amplifier system 200 with more than three operational amplifiers, some or all of the other operational amplifiers may have one input coupled together.

The configuration controller 206 may connect or disconnect the operational amplifiers 201, 202 and 203 to operate individually or in various combinations so that the multi-operational amplifier system 200 has different functional characteristics. In one embodiment, the operational amplifiers 201, 202 and 203 are coupled so that operational amplifiers 201, 202 and 203 each operate as a unity buffer (see FIG. 4). In another embodiment, the operational amplifiers 201, 202 and 203 are coupled so that one operational amplifiers (e.g., 201 or 203) operates as a unity buffer and the other operational amplifiers (e.g., 202 and 203 or 201 and 202) are combined as a buffer (see FIG. 5 or 6). In yet another embodiment, the operational amplifiers 201, 202 and 203 are coupled so that operational amplifiers 201, 202 and 203 are combined to operate as a unity buffer (see FIG. 7).

Figure 3A:
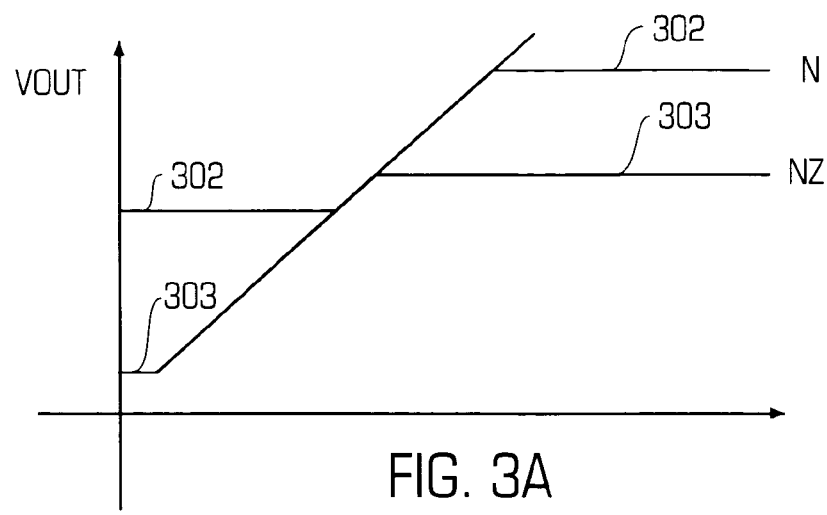
FIG. 3A is a graph illustrating input-output transfer characteristics of a multi-operational amplifier system including N-type NMOS and NZ NMOS transistor inputs.

FIG. 3A is a graph illustrating input-output transfer characteristics of a multi-operational amplifier system 200 including N-type NMOS and NZ NMOS transistor inputs.

A Z-shaped N line 302 illustrates the input-output transfer characteristics of an operational amplifier having an input differential pair as a N-type NMOS transistor pair. A Z-shaped NZ line 303 illustrates the input-output transfer characteristics of an operational amplifier having an input differential pair as a NZ NMOS transistor pair. The multi-operational amplifier system 200 is configurable to select different transfer characteristics such as N-type NMOS transistor or NZ NMOS transistor, or both.

Figure 3B:
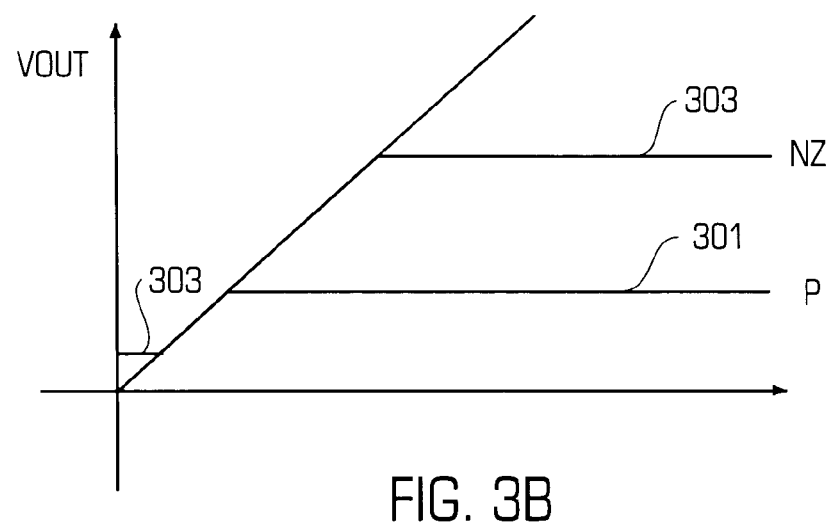
FIG. 3B is a graph illustrating the input-output transfer characteristics of a multi-operational amplifier system including NZ NMOS and PMOS transistor inputs.

FIG. 3B is a graph illustrating the input-output transfer characteristics of a multi-operational amplifier system 200 including NZ NMOS and PMOS transistor inputs.

A P line 301 having a sloped portion and a flat portion illustrates the input-output transfer characteristics of an operational amplifier having an input differential pair as a PMOS transistor pair. A Z-shaped NZ NMOS line 303 illustrates the input-output transfer characteristics of an operational amplifier having an input differential pair as a NZ NMOS transistor pair. The multi-operational amplifier system 200 is configurable to select different transfer characteristics, such as PMOS transistor or NZ NMOS transistor or both.

Figure 3C:
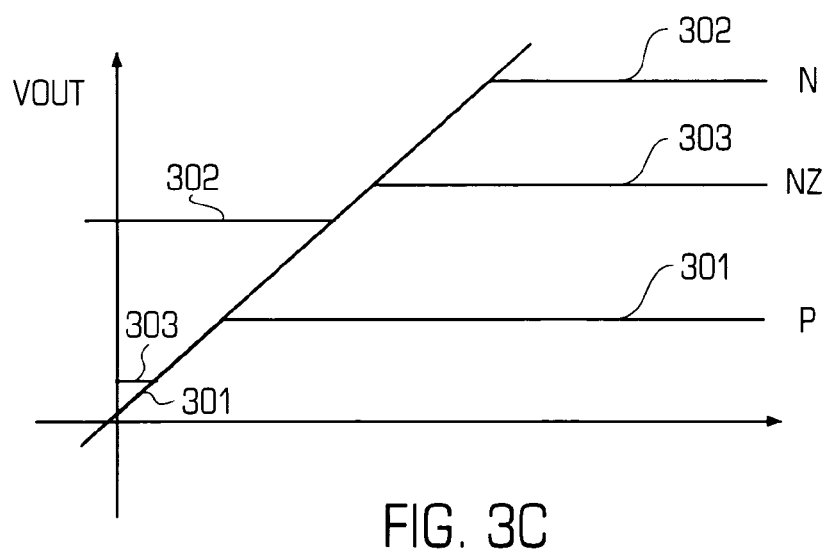
FIG. 3C is a graph illustrating the input-output transfer characteristics of the multi-operational amplifier system including NZ NMOS, N-type NMOS, and PMOS transistor inputs.

FIG. 3C is a graph illustrating the input-output transfer characteristics of the multi-operational amplifier system 200 including NZ NMOS, N-type NMOS, and PMOS transistor inputs.

The lines 301, 302, 303 as described above illustrate the input-output transfer characteristics of an operational amplifier having different input differential pairs, such as PMOS, N-type NMOS and NZ NMOS transistors. The multi-operational amplifier system 200 is configurable to select different transfer characteristics, such as PMOS, N-type NMOS, or NZ NMOS transistors, or combinations of pairs of these transistor types or all three of these transistor types.

FIGS. 4–7 illustrate different configurations of the multi-operational amplifier system. In FIGS. 4–7, the configurations are shown as external connections. In an alternative embodiment, the configuration controller 206 and the interconnect network 208 control the configuration with appropriate selection of connections within the interconnect network 208. For clarity, the interconnection network 208 is not shown, and not all inputs to the multi-operational amplifier system 200 are labeled in FIGS. 4–7.

Figure 4:
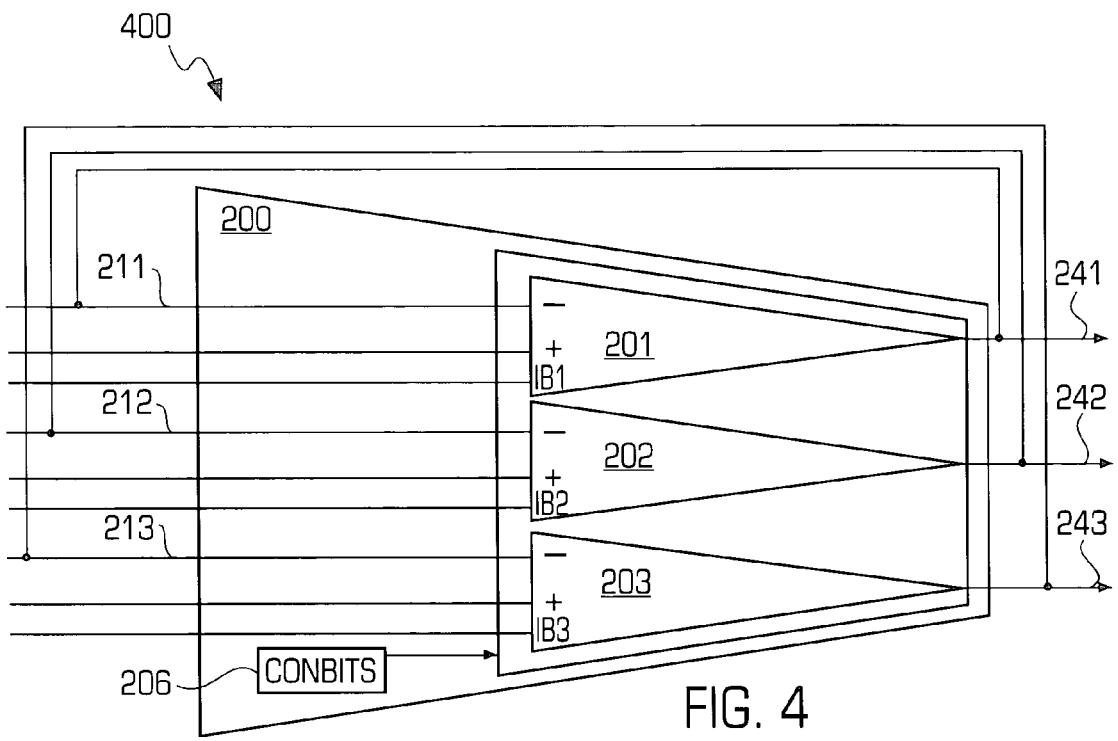
FIG. 4 is a block diagram illustrating a multi-operational amplifier system comprising a plurality of operational amplifiers each operating as unity buffers.

FIG. 4 is a block diagram illustrating a multi-operational amplifier system 400.

The multi-operational amplifier system 400 comprises a multi-operational amplifier system 200 arranged with the operational amplifiers 201, 202 and 203 each operating as a unity buffer. The negative inputs 211, 212, 213 of the respective operational amplifiers 201, 202 and 203 are coupled to respective outputs 241, 242, 243 of the respective operational amplifier.

Figure 5:
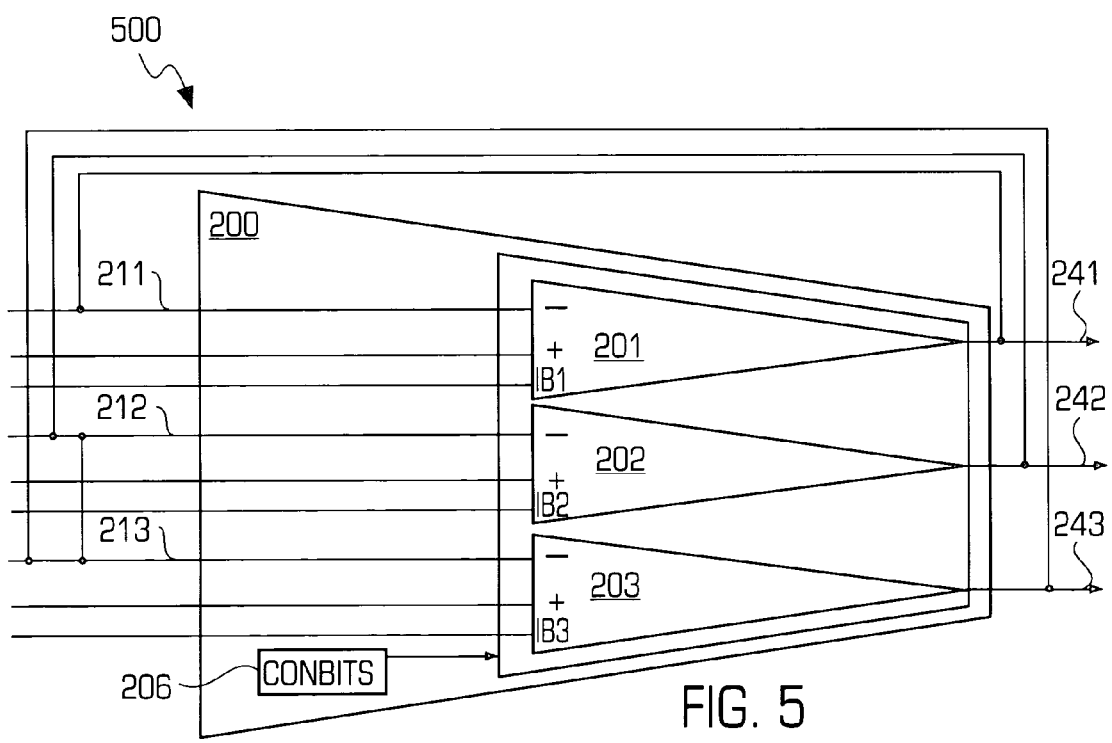
FIG. 5 is a block diagram illustrating a multi-operational amplifier system comprising an operational amplifier operating as a unity buffer and a plurality of operational amplifiers operating as buffers in combination.

FIG. 5 is a block diagram illustrating a multi-operational amplifier system 500.

The multi-operational amplifier system 500 comprises a multi-operational amplifier system 200 arranged with the operational amplifier 201 operating as a unity buffer and the operational amplifiers 202 and 203 combined as a buffer. The negative input 211 of the operational amplifier 201 is coupled to the output 241 of the operational amplifier 201. The negative inputs 212 and 213 of the operational amplifiers 202 and 203 are coupled to each other and coupled to the outputs 242 and 243 of the respective operational amplifier.

Figure 6:
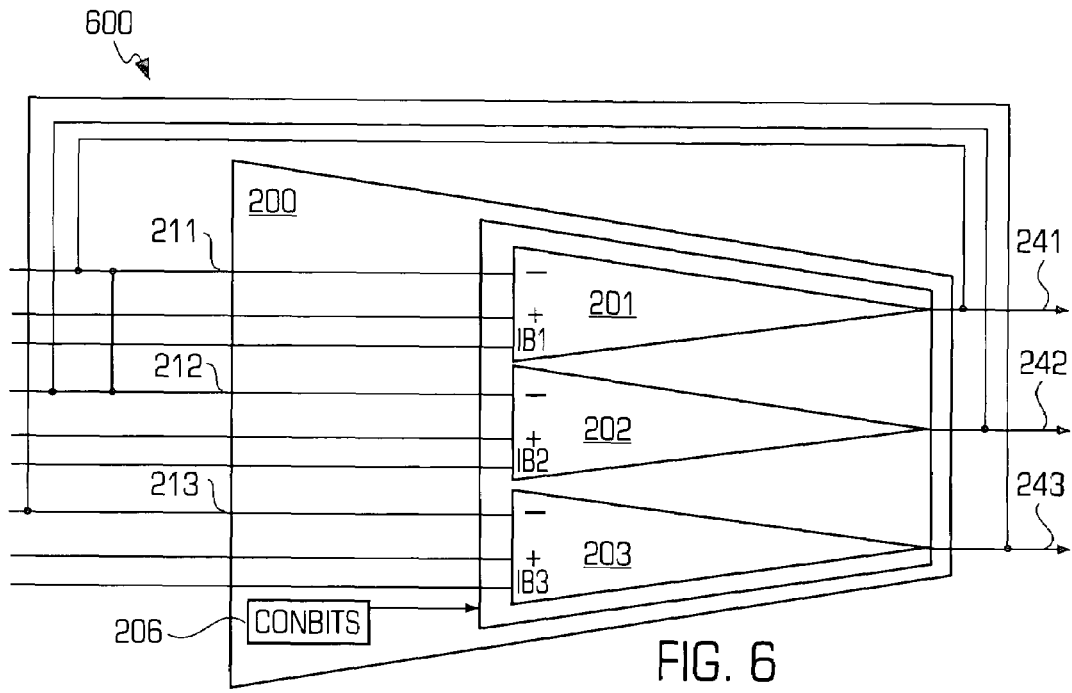
FIG. 6 is a block diagram illustrating a multi-operational amplifier system comprising an operational amplifier operating as a buffer and a plurality of operational amplifiers operating as a buffer in combination.

FIG. 6 is a block diagram illustrating a multi-operational amplifier 600.

The multi-operational amplifier 600 comprises a multi-operational amplifier system 200 arranged with the operational amplifiers 201 and 202 combined as a buffer, and the operational amplifier 203 operating as a unity buffer. The negative inputs 211 and 212 of the operational amplifiers 201 and 202 are coupled to each other and to the output 241 and 242 of the respective operational amplifier. The negative input 213 of the operational amplifier 203 is coupled to the output 243 of the operational amplifier 203.

Figure 7:
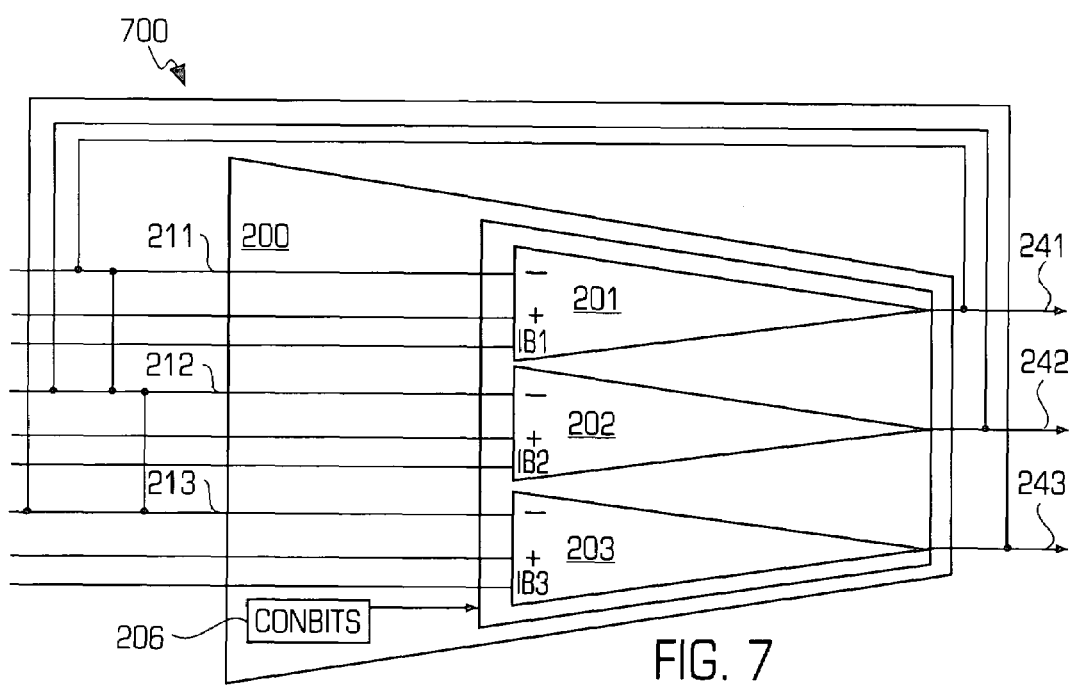
FIG. 7 is a block diagram illustrating a multi-operational amplifier system comprising a plurality of operational amplifiers combined as a unity buffer.

FIG. 7 is a block diagram illustrating a multi-operational amplifier system 700.

The multi-operational amplifier system 700 comprises a multi-operational amplifier system 200 arranged with the operational amplifiers 201, 202 and 203 operating as a unity buffer. The negative inputs 211, 212, 213 of the operational amplifiers 201, 202 and 203 are coupled to each other and coupled to the respective outputs 241, 242, 243 of the respective operational amplifier.

Figure 8:
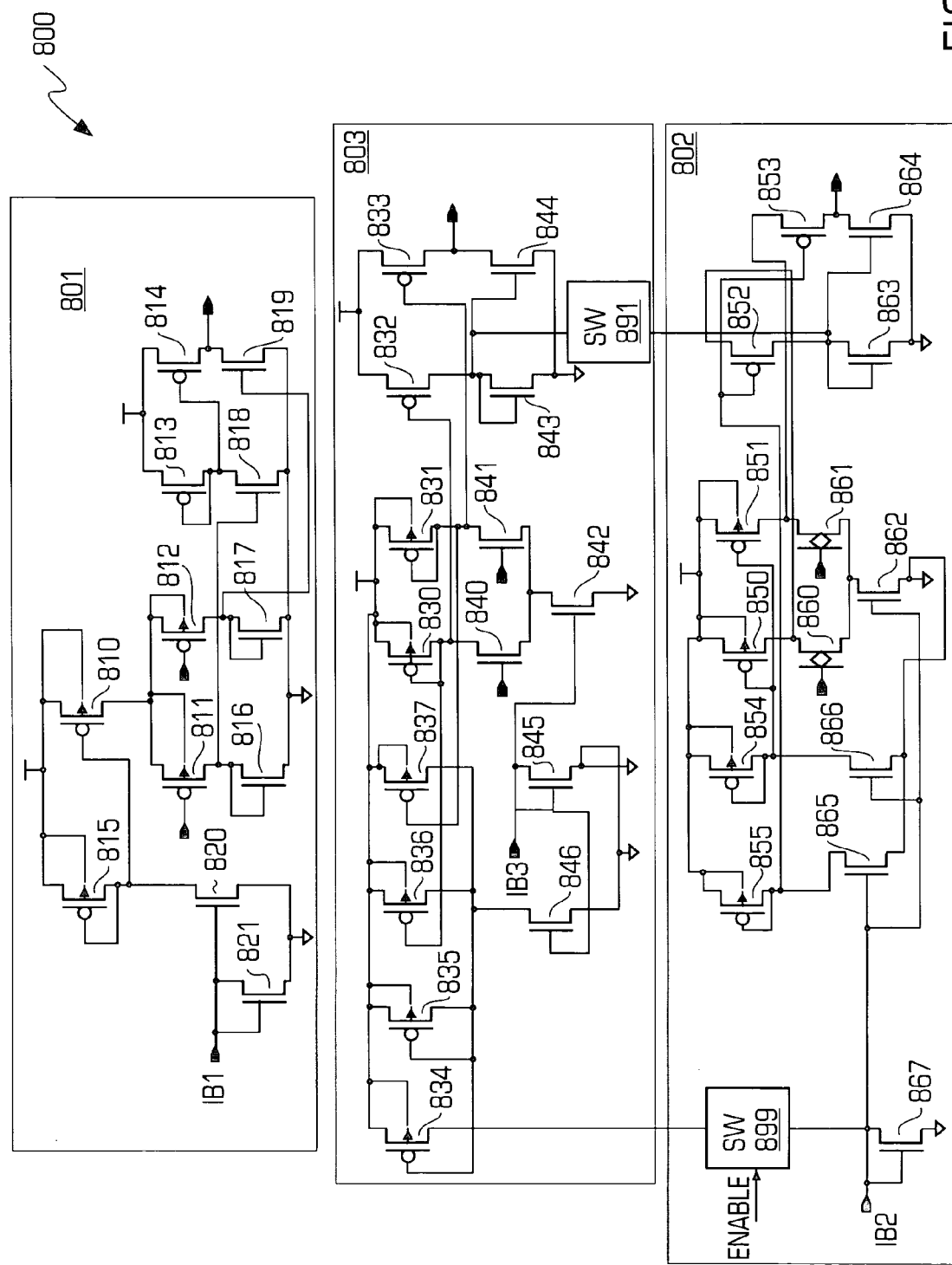
FIG. 8 is a schematic diagram illustrating a multi-operational amplifier system with fixed bias for a PMOS-based operational amplifier and adaptive bias switching for NMOS-based operational amplifiers.

FIG. 8 is a schematic diagram illustrating a multi-operational amplifier system 800.

The multi-operational amplifier system 800 includes fixed bias for a PMOS based operational amplifier and adaptive bias switching for NMOS based operational amplifiers. The multi-operational amplifier system 800 comprises a plurality of operational amplifiers 801, 802 and 803, which may be used for the respective operational amplifiers 201, 202, and 203 (FIG. 2).

The operational amplifier 801 is an output transconductance amplifier with a p-channel input differential pair. The operational amplifier 801 comprises a plurality of PMOS transistors 810 through 814 and a plurality of NMOS transistors 816 through 819 arranged as an output transconductance amplifier, and further comprises a diode connected PMOS transistor 815 and a plurality of NMOS transistors 820 and 821 arranged to bias the differential pair in response to an applied bias current (IB 1). The gates of the PMOS transistors 811 and 812 receive the negative and positive inputs of the operational amplifier 801.

The operational amplifier 802 is a folded cascode operational amplifier with an NZ channel input differential pair. In an alternate embodiment, the operational amplifier 802 may be an output transconductance amplifier. The operational amplifier 802 comprises a plurality of PMOS transistors 850 through 853 and a plurality of NMOS transistors 860 through 864 arranged as a folded cascode operational amplifier. The gates of the NMOS transistors 860 and 861 receive the negative and positive inputs of the operational amplifier 802. In one embodiment, the NMOS transistors 860 and 861 are NZ NMOS transistors. The operational amplifier 802 further comprises a plurality of PMOS transistors 854 and 855 and a plurality of NMOS transistors 865 through 867 to bias the folded cascode operational amplifier. The NMOS transistors 863 and 864 of the folded cascode amplifier are biased by the operational amplifier 803 as described below. The operational amplifier 802 further comprises a switch 899 that couples a common mode range detection circuit of the operational amplifier 803 (described below) in response to an enable signal. The operational amplifier 802 further comprises a diode connected NMOS transistor 867 that biases the NMOS transistor 862 of the folded cascode operational amplifier in response to a bias current.

The operational amplifier 803 comprises a plurality of PMOS transistors 830 through 833 and a plurality of NMOS transistors 840 through 844 that are arranged as an output transconductance amplifier with an n-channel input differential pair formed of the NMOS transistors 840 and 841. The operational amplifier 803 further comprises a diode connected NMOS transistor 845 to bias the NMOS transistor 842 of the output transconductance amplifier in response to a bias current. The operational amplifier 803 further comprises a common mode range detection circuit that includes a plurality of PMOS transistors 834 through 837 and an NMOS transistor 846. The common mode range detection automatically detects the common mode range and switches the bias from the current operational amplifier 802 to the next operational amplifier 803 to actively maintain constant bias. The PMOS transistor 832 biases the NMOS transistors 863 and 864 of the operational amplifier 802. The PMOS transistor 834 provides the bias through the switch 899 of the operational amplifier 802 when enabled to bias the operational amplifier 802 in an adaptive bias switching mode. The configuration controller 206 (FIG. 2) may provide the control of the switch 899 to configure the multi-operational amplifier system 800.

Figure 9A:
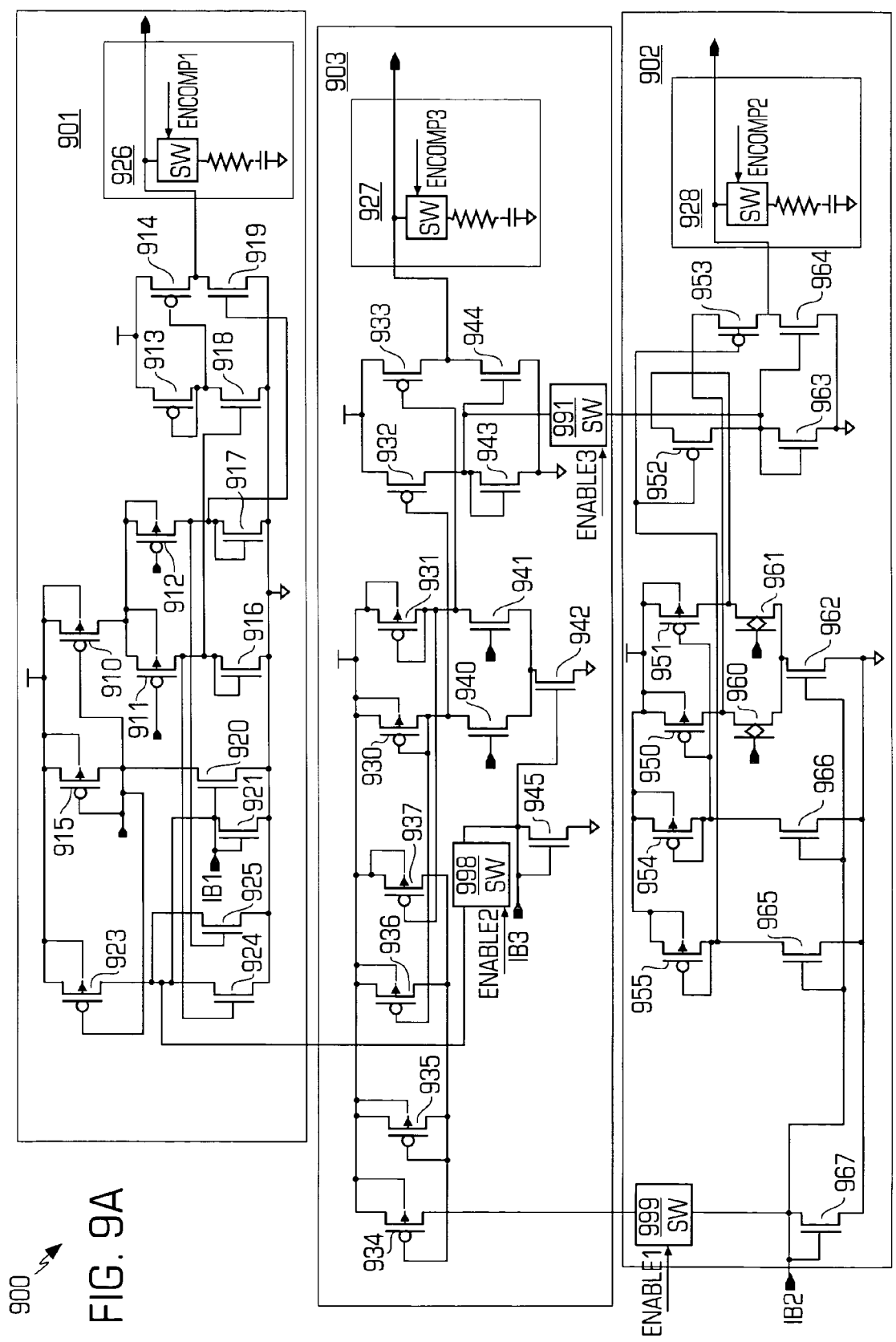
FIG. 9A is a schematic diagram illustrating a first embodiment of a multi-operational amplifier system including adaptive bias switching for PMOS-based and NMOS-based operational amplifiers.

FIG. 9A is a schematic diagram illustrating a multi-operational amplifier system 900.

The multi-operational amplifier system 900 includes adaptive bias switching for both PMOS and NMOS based operational amplifiers. The multi-operational amplifier system 900 comprises a plurality of operational amplifiers 901, 902 and 903, which may be used for the respective operational amplifiers 201, 202, and 203 (FIG. 2).

The operational amplifier 901 is an output transconductance amplifier with a p-channel input differential pair. The operational amplifier 901 comprises a plurality of PMOS transistors 910 through 914 and a plurality of NMOS transistors 916 through 919 arranged as an output transconductance amplifier, and further comprises a diode connected PMOS transistor 915 and a plurality of NMOS transistors 920 and 921 arranged to bias the differential pair in response to an applied bias current (IB1). The gates of the PMOS transistors 911 and 912 receive the negative and positive inputs of the operational amplifier 901. The operational amplifier 901 further comprises a common mode range detection circuit that includes a PMOS transistor 923 and a plurality of NMOS transistors 924 and 925. The common mode range detection automatically detects the common mode range and switches the bias from the current operational amplifier 901 to the next operational amplifier 903 to actively maintain constant bias. The operational amplifier 901 further comprises a compensation network 926, such as a RC network, for stability compensation.

The operational amplifier 902 is a folded cascode operational amplifier with an NZ channel input differential pair. In an alternate embodiment, the operational amplifier 902 may be an output transconductance amplifier. The operational amplifier 902 comprises a plurality of PMOS transistors 950 through 953 and a plurality of NMOS transistors 960 through 964 arranged as a folded cascode operational amplifier. The gates of the NMOS transistors 960 and 961 receive the negative and positive inputs of the operational amplifier 902. In one embodiment, the NMOS transistors 960 and 961 are NZ NMOS transistors. The operational amplifier 902 further comprises a plurality of PMOS transistors 954 and 955 and a plurality of NMOS transistors 965 and 966 to bias the folded cascode operational amplifier. The NMOS transistors 963 and 964 of the folded cascode amplifier are biased by the operational amplifier 903 as described below. The operational amplifier 902 further comprises a switch 999 that couples a common mode range detection circuit of the operational amplifier 903 (described below) in response to an enable signal. The operational amplifier 902 further comprises a diode connected NMOS transistor 967 that biases the NMOS transistor 962 of the folded cascode operational amplifier in response to a bias current. The operational amplifier 902 further comprises a compensation network 928, such as a RC network, for stability compensation.

The operational amplifier 903 comprises a plurality of PMOS transistors 930 through 933 and a plurality of NMOS transistors 940 through 944 that are arranged as an output transconductance amplifier with an n-channel input differential pair formed of the NMOS transistors 940 and 941. The operational amplifier 903 further comprises a diode connected NMOS transistor 945 to bias the NMOS transistor 942 of the output transconductance amplifier in response to a bias current. The operational amplifier 903 further comprises a common mode range detection circuit that includes a plurality of PMOS transistors 934 through 937 and an NMOS transistor 946. The common mode range detection automatically detects the common mode range and switches the bias from the current operational amplifier 902 to the next operational amplifier 903 to actively maintain constant bias. The PMOS transistor 932 biases the NMOS transistors 963 and 964 of the operational amplifier 902. The PMOS transistor 934 provides the bias through the switch 999 of the operational amplifier 902 when enabled to bias the operational amplifier 902 in an adaptive bias switching mode. The operational amplifier 903 further comprises a switch 998 to switch the common mode range detection circuit to change the bias of the operational amplifier 903, and further comprises a switch 991 to couple the drain of the transistor 943 to the drain of the transistor 963 to combine the transfer characteristics of the operational amplifiers 902 and 903. The configuration controller 206 (FIG. 2) may provide the control of the switches 999, 998 and 991, for example, using enable signals ENABLE1, ENABLE2, and ENABLE3, respectively, to configure the multi-operational amplifier system 900. The operational amplifier 903 further comprises a compensation network 927, such as an RC network, for stability compensation.

The compensation networks 926, 927, and 928 each may include a switch for selectively coupling the compensation network to the output of the respective operational amplifier 901, 902, and 903, in response to a respective enable compensation signal ENCOMP1, ENCOMP2, and ENCOMP3. The compensation networks 926, 927, 928 may be configured individually or in combination. The multi-operational amplifier systems shown in FIGS. 8, 10, and 11 may include similar compensation networks. In one embodiment, two or more operational amplifiers 901, 902, 903 may share a compensation network. In another embodiment, one operational amplifier 901, 902 or 903 may use more than one compensation network. The configuration controller 206 provides the enable compensation signal for controlling the compensation networks 927, 928, 929 to control the stability of the multi-operational amplifier system. The configuration controller 206 may disconnect the compensation networks so that the operational amplifier can be used as a comparator for higher comparison speeds.

Figure 9B:
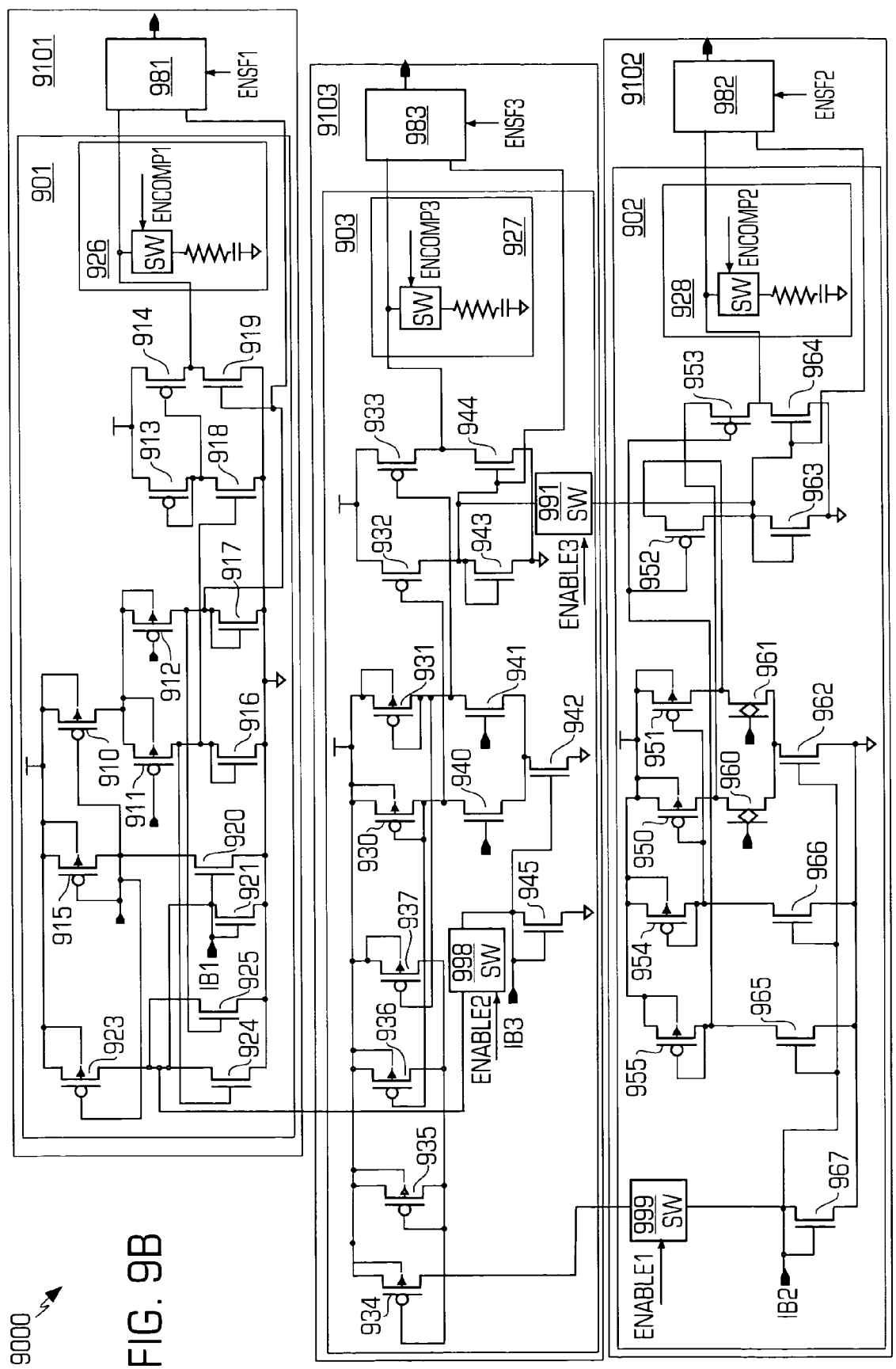
FIG. 9B is a schematic diagram illustrating a second embodiment of a multi-operational amplifier system including adaptive bias switching for PMOS-based and NMOS-based operational amplifiers.

FIG. 9B is a schematic diagram illustrating a multi-operational amplifier system 9000.

The multi-operational amplifier system 9000 comprises a plurality of operational amplifiers 9101 through 9103, which includes the respective operational amplifiers 901, 902, and 903 described above in conjunction with the multi-operational amplifier system 900 (FIG. 9A), and furthers includes a plurality of output circuits 981, 982, 983, respectively, coupled to the output of the respective operational amplifiers 901, 902, 903. A first input of the output circuits 981, 982, and 983 is coupled to the respective drain of the PMOS transistors 914, 953, and 933. A second input of the output circuit 981, 982, 983 is coupled to the gate of the respective NMOS transistor 919, 964, 944. The output circuits 981, 982, 983 are enabled by a respective enable output signal ENSF1, ENSF2, ENSF3.

Figure 9C:
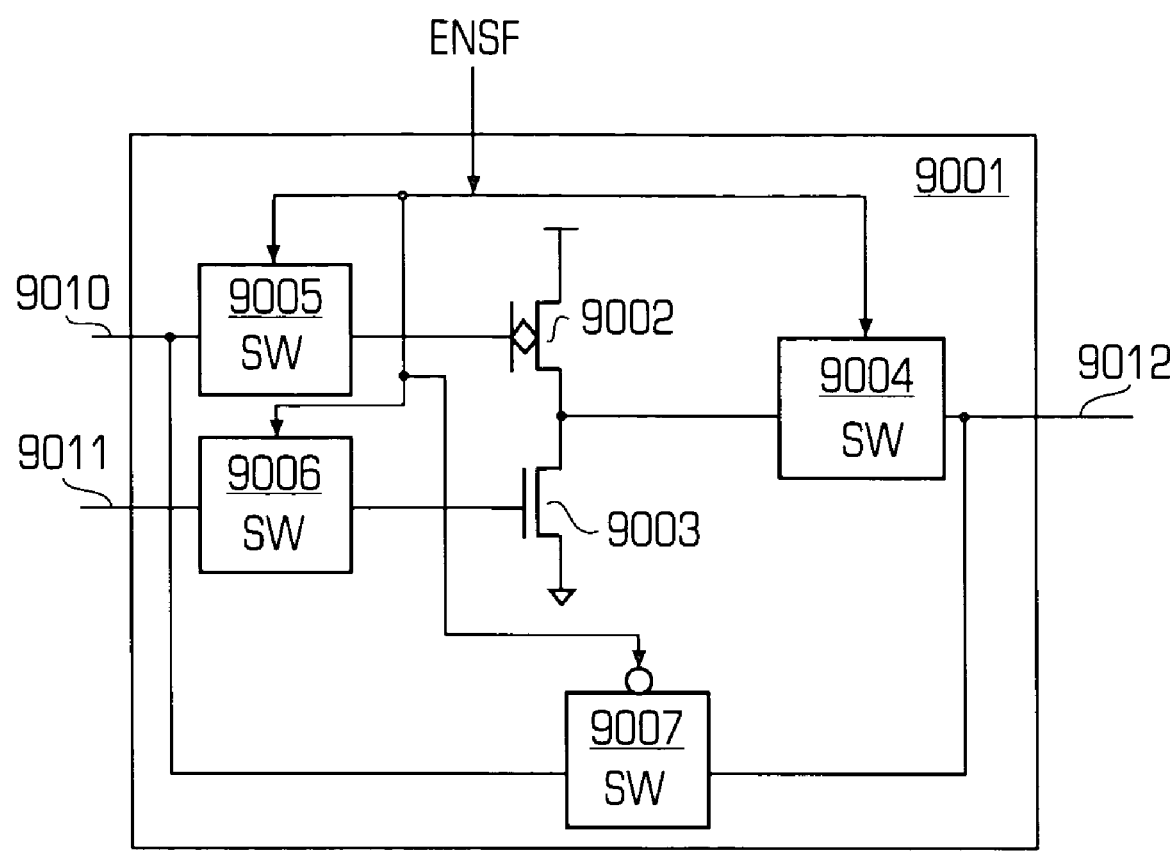
FIG. 9C is a schematic diagram illustrating an output stage of the multi-operational amplifier system of FIG. 9B.

FIG. 9C is a schematic diagram illustrating a output circuit 9001.

In one embodiment, the output circuit 9001 is arranged as a source follower. The output circuits 981, 982, and 983 may be arranged as the output circuit 9001. The output circuit 9001 comprises a native NMOS transistor 9002, an NMOS transistor 9003, and a plurality of switches 9004 through 9007. An input 9010 of the output stage 9001 is coupled to the drain of the corresponding PMOS transistor 914, 933, 953 (FIG. 9B). A second input 9011 is coupled to the gate of the corresponding NMOS transistors 919, 944, and 964. The switch 9007 couples the input 9010 to an output 9012 of the output circuit 9001 in response to an inverted enable output signal (ENSF) being in a low state. In response to the enable output stage (ENSF) signal being high, the switches 9005 and 9006 couple the inputs 9010 and 9011, respectively, to the gate of the respective NMOS transistor 9002 and 9003. The switch 9004 is also enabled to couple the source follower output signal of the NMOS transistor 9002 to the output 9012.

Figure 10:
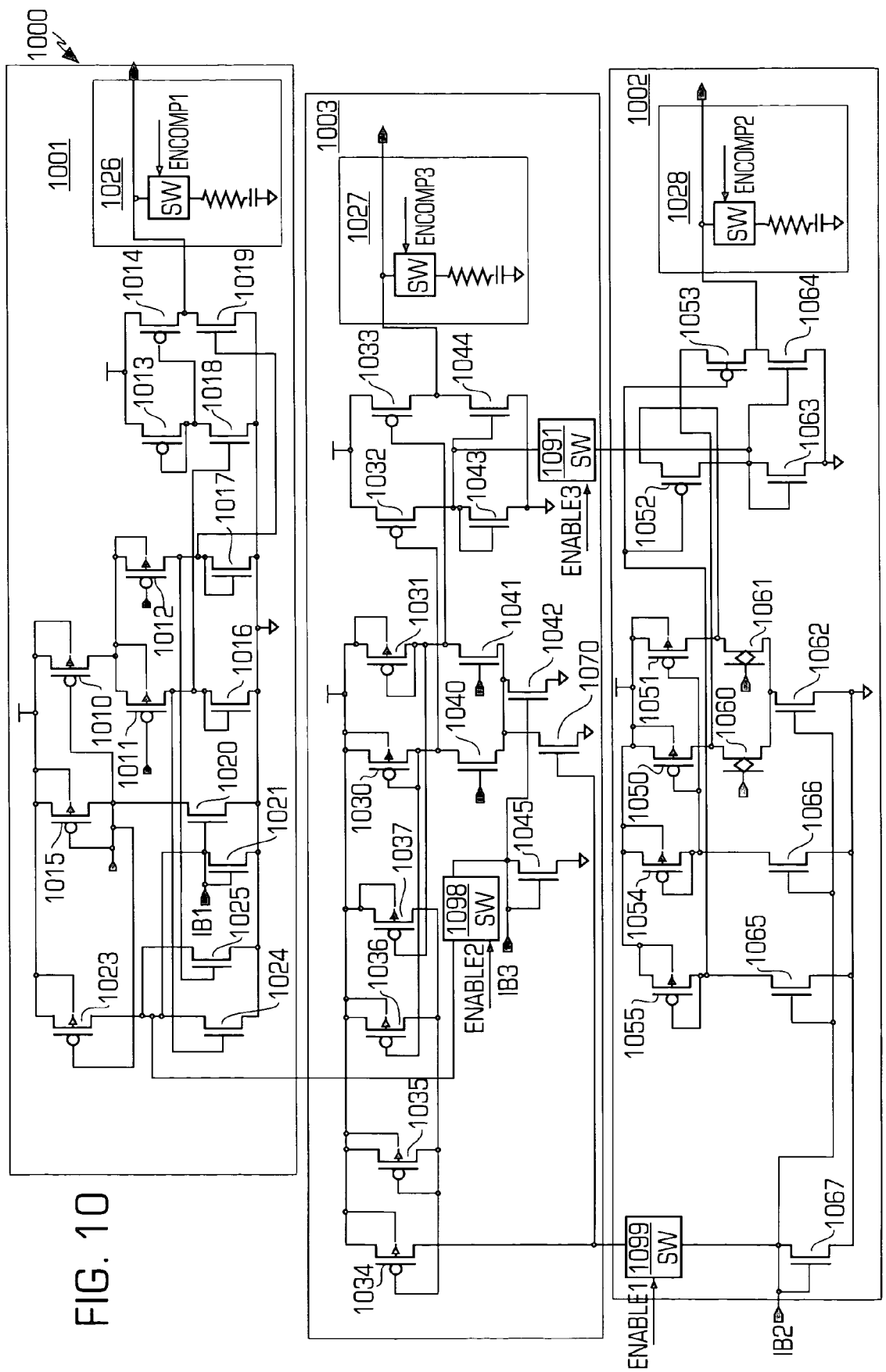
FIG. 10 is a schematic diagram illustrating a multi-operational amplifier system including adaptive bias switching for PMOS-based and NMOS-based operational amplifiers and enhanced bias switching for the NMOS-based differential pair.

FIG. 10 is a schematic diagram illustrating a multi-operational amplifier system 1000.

The multi-operational amplifier system 1000 includes adaptive bias switching for both PMOS and NMOS based operational amplifiers and enhanced bias for the NMOS-based differential pair. The multi-operational amplifier system 1000 comprises a plurality of operational amplifiers 1001, 1002 and 1003, which may be used for the respective operational amplifiers 201, 202, and 203 (FIG. 2).

The operational amplifier 1001 is an output transconductance amplifier with a p-channel input differential pair. The operational amplifier 1001 comprises a plurality of PMOS transistors 1010 through 1015, 1023, a plurality of NMOS transistors 1016 through 1021 and 1024 through 1025, and a compensation network 1026 arranged in a similar manner as the respective PMOS transistors 910 through 915 and 923, NMOS transistors 916 through 921 and 924 through 925, and a compensation network 926 of the operational amplifier 901 in FIG. 9.

The operational amplifier 1002 is a folded cascode operational amplifier with an NZ channel input differential pair. In an alternate embodiment, the operational amplifier 1002 may be an output transconductance amplifier. The operational amplifier 1002 comprises a plurality of PMOS transistors 1050 through 1055, a plurality of NMOS transistors 1060 through 1067, a compensation network 1028, and a switch 1099 arranged in a similar manner as the respective PMOS transistors 950 through 955, NMOS transistors 960 through 967, a compensation network 927, and switch 999 of the operational amplifier 902 in FIG. 9.

The operational amplifier 1003 is an output transconductance amplifier with an n-channel input differential pair. The operational amplifier 1003 comprises a plurality of PMOS transistors 1030 through 1037, a plurality of NMOS transistors 1040 through 1046, a compensation network 1027, and a plurality of switches 1091 and 1098 arranged in a similar manner as the respective PMOS transistors 930 through 937, NMOS transistors 940 through 946, compensation network 928, and switches 991 and 998 of the operational amplifier 903 in FIG. 9.

The operational amplifier 1003 further comprises an NMOS transistor 1070 coupled in parallel with the NMOS transistor 1042 to provide enhanced bias to increase the bias during transition of the switching between operational amplifiers 1001, 1002 and 1003.

Figure 11:
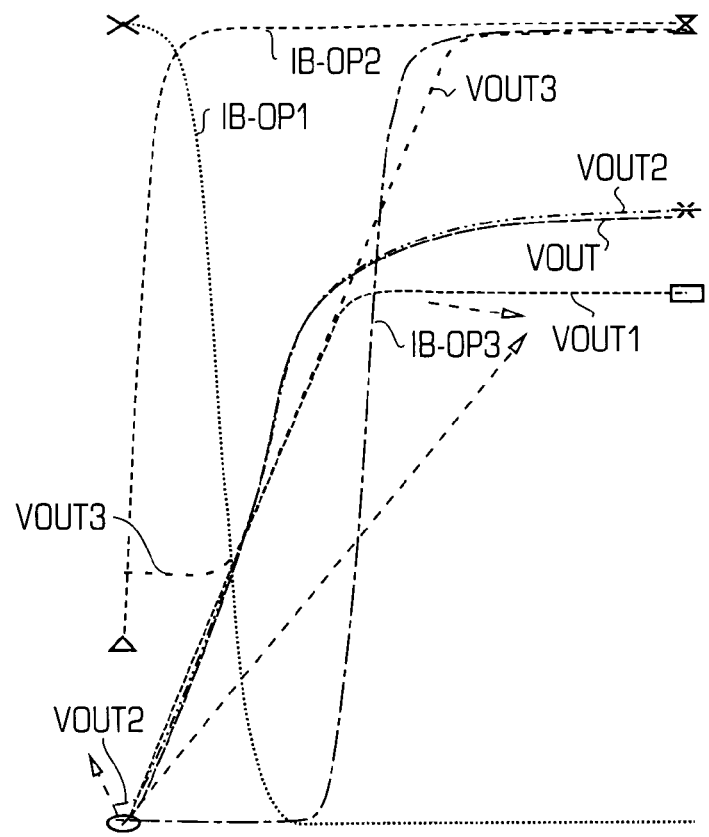
FIG. 11 is a graph illustrating transfer characteristics for bias and outputs for PMOS-based and NMOS-based conventional operational amplifiers.

FIG. 11 is a graph illustrating the transfer characteristics for bias and outputs for PMOS-based and NMOS-based conventional operational amplifiers.

Lines IB-OP1 and VOUT1 show the transfer characteristics of a bias current and output voltage, respectively, of an operational amplifier that is an output transconductance amplifier with a p-channel input pair. Lines IB-OP2 and VOUT2 show the transfer characteristics of a bias current and output voltage, respectively, of an operational amplifier that is an output transconductance amplifier with an NZ NMOS channel input pair. Lines IB-OP3 and VOUT3 show the transfer characteristics of the bias current and output voltage, respectively, of an operational amplifier that is an output transconductance amplifier with an N-type NMOS channel input pair. A line VOUT shows the output voltage of the combination of the three operational amplifiers. As shown in FIG. 11, the output voltage VOUT does not linearly follow the input voltage. The bias current is not constant over the full input range.

Figure 12:
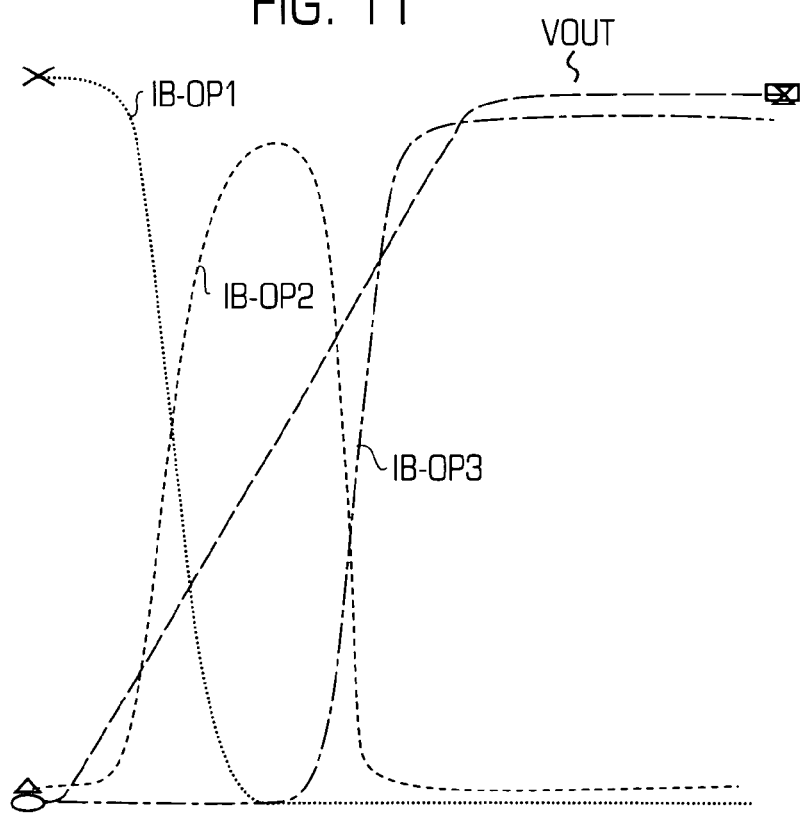
FIG. 12 is a graph illustrating transfer characteristics for bias and outputs for the PMOS and NMOS-based operational amplifiers of the multi-operational amplifier system of FIG. 9.

FIG. 12 is a graph illustrating transfer characteristics for bias and outputs for the PMOS and NMOS-based operational amplifiers of the multi-operational amplifier system 900 (FIG. 9).

Lines IB-OP1, IB-OP2, and IB-OP3 show the bias applied to the operational amplifiers 901, 902, and 903, respectively, of the multi-operational amplifier system 900. As shown, the bias is switched from the operational amplifier 901 to the operational amplifier 902 and operational amplifier 903 to maintain a constant bias for the multi-operational amplifier system 900. A line VOUT shows the output voltage, which linearly follows the input over the whole range.

Figure 13:
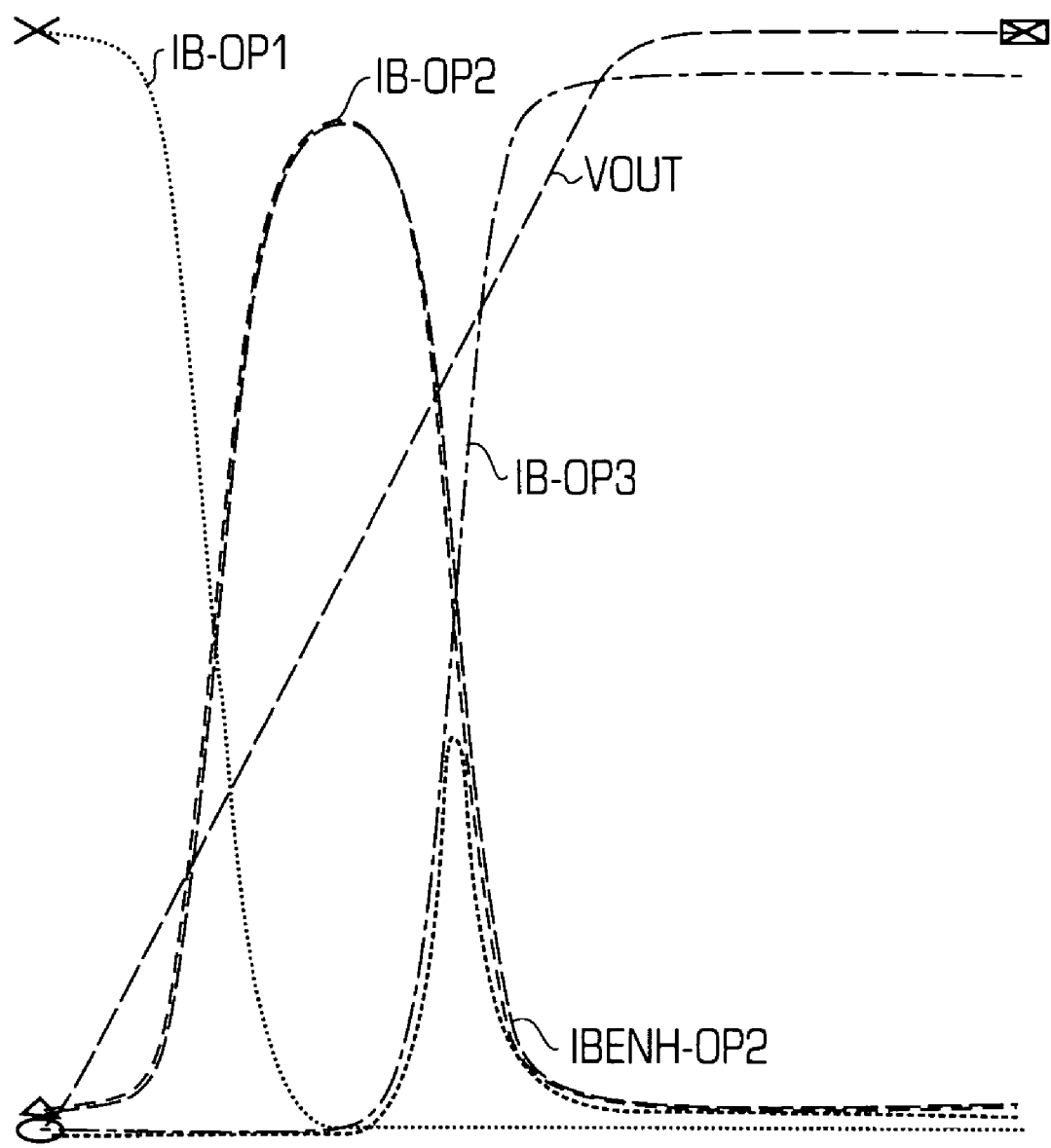
FIG. 13 is a graph illustrating the transfer characteristics for bias and outputs and enhanced bias for the multi-operational amplifier system of FIG. 10.

FIG. 13 is a graph illustrating the transfer characteristics for bias and outputs, and enhanced bias for the multi-operational amplifier system 1000 of FIG. 10.

Lines IB-OP1, IB-OP2, and IB-OP3 show the bias applied to the operational amplifiers 1001, 1002, and 1003, respectively, of the multi-operational amplifier system 100. As shown, the bias is switched from the operational amplifier 1001 to the operational amplifier 1002 and operational amplifier 1003 to maintain a constant bias for the multi-operational amplifier system 1000. A line VOUT shows the output voltage, which linearly follows the input over the whole range A line IB-ENH-OP2 shows the bias current applied for the enhanced biasing of the operational amplifier 1002. A line VOUT shows the output voltage of the multi-operational amplifier system 1000.

In this disclosure, there is shown and described only the preferred embodiments of the invention, but it is understood that the invention is capable of use in various other combinations and environments and is capable of changes or modifications within the scope of the inventive concept as expressed herein.

What is claimed is:

1. A multi-operational amplifier system comprising:
a plurality of operational amplifiers each having inputs; and
a controller configured to interconnect the inputs of the plurality of operational amplifiers to form an adaptive input range of said system;
wherein each of said plurality of operational amplifiers having a first input, the first input of one of said plurality of operational amplifiers being coupled to a first node, the first inputs of at least two others of said plurality of operational amplifiers being coupled to a second node, the second node being different than said first node.

2. The multi-operational amplifier system of claim 1 wherein an input of one of said plurality of operational amplifiers is coupled to an input of at least one other of said plurality of operational amplifiers.

3. A multi-operational amplifier system comprising:
a plurality of operational amplifiers each having inputs; and
a controller configured to interconnect the inputs of the plurality of operational amplifiers to form an adaptive input range of said system;
wherein each operational amplifier includes a compensation network, and an output of one of said plurality of operational amplifiers is coupled to an input of a compensation network of at least one other of said plurality of operational amplifier.

4. The multi-operational amplifier system of claim 3 wherein an input of one of said plurality of operational amplifiers is coupled to an input of at least one other of said plurality of operational amplifiers.

5. A multi-operational amplifier system comprising:
a first operational amplifier having an input formed of an NZ NMOS transistor;
a second operational amplifier including an input formed of a PMOS transistor;
a controller configured to adaptively interconnect the inputs; and
a third operational amplifier having an input formed of a N-type NMOS transistor.

6. A multi-operational amplifier system comprising a first operational amplifier having an input formed of a NZ NMOS transistor and of an n-type NMOS transistor, a second operational amplifier having at least one input, and a controller configured to adaptively interconnect the input of the first operational amplifier and the input of the second operational amplifier to form an adaptive input range of said system.

7. A multi-operational amplifier system comprising:
a plurality of operational amplifiers, one of said operational amplifiers having a fixed bias, another of said operational amplifiers having an adaptively switchable current bias; and
a controller to adaptively interconnect the plurality of operational amplifiers and to select the adaptively switchable current bias.

8. The multi-operational amplifier system of claim 7 wherein an input of one of said plurality of operational amplifiers is coupled to an input of at feast one other of said plurality of operational amplifiers.

9. A multi-operational amplifier system comprising:
a plurality of operational amplifiers, one of said operational amplifiers having a switchable bias, another of said operational amplifiers having a switchable current bias; and
a controller to adaptively interconnect the plurality of operational amplifiers and to select said switchable bias or said switchable current bias.

10. The multi-operational amplifier system of claim 9 wherein an input of one of said plurality of operational amplifiers is coupled to an input of at least one other of said plurality of operational amplifiers.

11. A multi-operational amplifier system comprising:
a plurality of operational amplifiers, one of said operational amplifiers having a switchable bias, another of said operational amplifiers having an adaptively switchable current bias; and
a controller to adaptively interconnect the plurality of operational amplifiers to select said switchable bias or said switchable current bias.

12. The multi-operational amplifier system of claim 11 wherein said another operational amplifier adaptively switches its current bias based on the switchable bias of said one operational amplifier.

13. A multi-operational amplifier system comprising;
a plurality of operational amplifiers, one of said operational amplifiers having a switchable bias, another of said operational amplifiers having an adaptively switchable current bias; and
a controller to adaptively interconnect the plurality of operational amplifiers to select said switchable bias or said switchable current bias;
wherein said another operational amplifier selectively switches a compensation network based on a compensation usage of said one operational amplifier.

14. A multi-operational amplifier system comprising:
a first operational amplifier configured as an output transconductance amplifier;
a second operational amplifier configured as an output transconductance amplifier;
a third operational amplifier configured as a folded cascade operational amplifier; and
A controller configured to adaptively interconnect the first operational amplifier, the second operational amplifier, and the third operational amplifier.

15. The multi-operational amplifier system of claim 14 wherein said first operational amplifier includes a PMOS input differential pair.

16. The multi-operational amplifier system of claim 14 wherein said second operational amplifier includes an NZ NMOS input differential pair.

17. The multi-operational amplifier system of claim 14 wherein said third operational amplifier includes an N-type NMOS input differential pair.

18. The multi-operational amplifier system of claim 14 wherein the first, second, and third operational amplifiers each comprise an output stage that includes a source follower.

19. A multi-operational amplifier system comprising:
first, second, and third operational amplifiers each configured as an output transconductance amplifier, and a controller configured to adaptively interconnect the first, second, and third operational amplifiers to form an adaptive input range of said system.

20. The multi-operational amplifier system of claim 19 wherein the first operational amplifier includes a PMOS input differential pair.

21. A multi-operational amplifier system comprising:
first, second, and third operational amplifiers each configured as an output transconductance amplifier, and a controller configured to adaptively interconnect the first, second, and third operational amplifiers;
wherein the first operational amplifier includes a PMOS input differential pair; and
wherein said second operational amplifier includes a NZ NMOS input differential pair.

22. A multi-operational amplifier system comprising:
first, second, and third operational amplifiers each configured as an output transconductance amplifier, and a controller configured to adaptively interconnect the first, second, and third operational amplifiers;
wherein the first operational amplifier includes a PMOS input differential pair; and
wherein each of the first, second and third operational amplifiers includes a configurable compensation network.

23. The multi-operational amplifier system of claim 22 wherein the third operational amplifier includes a N-type NMOS input differential pair.

* * * * *